(12) United States Patent
Wang et al.

(10) Patent No.: US 11,895,905 B2
(45) Date of Patent: Feb. 6, 2024

(54) DISPLAY SUBSTRATE, PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Sen Wang, Beijing (CN); Li Jia, Beijing (CN); Bin Liu, Beijing (CN); Mingqi Gang, Beijing (CN); Shaojie Qin, Beijing (CN); Ming Yang, Beijing (CN); Jiandong Bao, Beijing (CN); Wei Wang, Beijing (CN); Xin Zhou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 210 days.

(21) Appl. No.: 17/482,446

(22) Filed: Sep. 23, 2021

(65) Prior Publication Data
US 2022/0238819 A1 Jul. 28, 2022

(30) Foreign Application Priority Data
Jan. 22, 2021 (CN) .......................... 202110093842.6

(51) Int. Cl.
*H10K 77/10* (2023.01)
*H10K 50/84* (2023.01)
(Continued)

(52) U.S. Cl.
CPC ........... *H10K 77/111* (2023.02); *H10K 50/84* (2023.02); *H10K 59/353* (2023.02); *H10K 71/00* (2023.02); *H10K 2102/311* (2023.02)

(58) Field of Classification Search
CPC .... H10K 77/111; H10K 50/84; H10K 59/353; H10K 71/00; H10K 2102/311;
(Continued)

(56) References Cited

U.S. PATENT DOCUMENTS

| 2021/0159296 A1* | 5/2021 | Kim | H10K 59/1213 |
| 2022/0140280 A1* | 5/2022 | Yang | H10K 77/111 257/40 |

(Continued)

FOREIGN PATENT DOCUMENTS

| CN | 105759477 A | 7/2016 |
| CN | 109859627 A | 6/2019 |
| CN | 112233559 A | 1/2021 |

*Primary Examiner* — J. E. Schoenholtz
(74) *Attorney, Agent, or Firm* — Ling Wu; Stephen Yang; Ling and Yang Intellectual Property

(57) ABSTRACT

Provided are a display substrate, a preparation method thereof, and a display apparatus. The display substrate includes a flexible substrate, a driving structure layer disposed on the flexible substrate, a light-emitting element disposed on the driving structure layer, and an encapsulation layer disposed on the light-emitting element. The flexible substrate includes a first flexible substrate layer, a first connection layer disposed on the first flexible substrate layer, and a second flexible substrate layer disposed on the first connection layer, wherein, the first connection layer includes at least one first via, and the first flexible substrate layer includes at least one first groove provided corresponding to the first via; the first via and the first groove are mutually communicated, and an orthographic projection of the first groove on the first flexible substrate layer includes an orthographic projection of the first via on the first flexible substrate layer.

20 Claims, 4 Drawing Sheets

(51) Int. Cl.
*H10K 59/35* (2023.01)
*H10K 71/00* (2023.01)
*H10K 102/00* (2023.01)

(58) Field of Classification Search
CPC .... H10K 59/1201; H10K 59/12; H10K 59/35; H10K 59/351; H10K 71/80
See application file for complete search history.

(56) References Cited

U.S. PATENT DOCUMENTS

| | | | |
|---|---|---|---|
| 2022/0216289 A1* | 7/2022 | Lee | B32B 3/30 |
| 2023/0040100 A1* | 2/2023 | Qin | H10K 59/121 |
| 2023/0056754 A1* | 2/2023 | Zeng | H10K 59/80 |

* cited by examiner

DISPLAY SUBSTRATE, PREPARATION METHOD THEREOF, AND DISPLAY APPARATUS

CROSS-REFERENCE TO RELATED APPLICATION

The present application claims the priority to Chinese Patent Application No. 202110093842.6 filed to the CNIPA on Jan. 22, 2021, the content of which is hereby incorporated by reference.

TECHNICAL FIELD

Embodiments of the present disclosure relate to, but are not limited to, the field of display technologies, in particular to a display substrate, a preparation method thereof, and a display apparatus.

BACKGROUND

A flexible display apparatus is a display apparatus based on a flexible substrate material. Since the flexible display apparatus has characteristics of curlability, a wide viewing angle, portability, and etc., it has received extensive attention in recent years.

A flexible substrate is usually made of a three-layer structure of a first flexible substrate layer, a connection layer, and a second flexible substrate layer. However, when the flexible substrate is curled, peeling often occurs between the second flexible substrate layer and the connection layer due to a weak adhesive force, which has severe impact on performance of a flexible product.

SUMMARY

The following is a summary about the subject matter described in the present disclosure in detail. The summary is not intended to limit the scope of protection of claims.

An embodiment of the present disclosure provides a display substrate, which includes a flexible substrate, a driving structure layer disposed on the flexible substrate, a light-emitting element disposed on the driving structure layer, and an encapsulation layer disposed on the light-emitting element. The flexible substrate includes a first flexible substrate layer, a first connection layer disposed on the first flexible substrate layer, and a second flexible substrate layer disposed on the first connection layer, the first connection layer includes at least one first via, and the first flexible substrate layer includes at least one first groove provided corresponding to the first via, the first via and the first groove are mutually communicated, and an orthographic projection of the first groove on the first flexible substrate layer includes an orthographic projection of the first via on the first flexible substrate layer.

In an exemplary embodiment, an orthographic projection of a surface of the first groove on a side close to the first via on the first flexible substrate layer is smaller than or equal to an orthographic projection of a surface of the first groove on a side away from the first via on the first flexible substrate layer.

In an exemplary embodiment, in a direction perpendicular to the display substrate, the first via includes a first surface on a side away from the first groove, a second surface on a side close to the first groove and opposite to the first surface, and a first side surface and a second side surface disposed between the first surface and the second surface; the first groove includes a third surface partially overlapped with the second surface, a fourth surface opposite to the third surface, and a third side surface and a fourth side surface disposed between the third surface and the fourth surface, wherein the first side surface and the third side surface are located on one side of the first via and the first groove, and the second side surface and the fourth side surface are located on the other side of the first via and the first groove; a distance between the first side surface of the first via and the third side surface of the first groove corresponding to the first via is 0.4 microns to 0.6 microns; and a distance between the second side surface of the first via and the fourth side surface of the first groove corresponding to the first via is 0.4 microns to 0.6 microns.

In an exemplary embodiment, the first flexible substrate layer and the second flexible substrate layer are made of a same material, the material of the first flexible substrate layer or the second flexible substrate layer includes one or a combination of more of polyimide, polyetherimide, polyphenylene sulfide, and polyarylate.

In an exemplary embodiment, in a direction parallel to the display substrate, a shape of the first via includes any one or more of the following: round, square, diamond, parallelogram, pentagon, and hexagon.

In an exemplary embodiment, in a direction perpendicular to the display substrate, a width of the first via is 5 to 20 microns.

In an exemplary embodiment, in a direction perpendicular to the display substrate, a height of the first groove 21 is 1 micron to 2 microns.

In an exemplary embodiment, the display substrate further includes a second connection layer and a third flexible substrate layer, wherein the second connection layer includes at least one second via, and the second flexible substrate layer includes at least one second groove; the second via and the second groove are mutually communicated, and an orthographic projection of the second groove on the first flexible substrate layer includes an orthographic projection of the second via on the first flexible substrate layer; and the orthographic projection of the second groove on the first flexible substrate layer is not overlapped with the orthographic projection of the first groove on the first flexible substrate layer.

An embodiment of the present disclosure further provides a display apparatus which includes any of the above display substrates.

An embodiment of the present disclosure further provides a preparation method of a display substrate, including: sequentially forming a first flexible substrate layer and a first connection layer on a rigid base substrate, wherein a first via is provided on the first connection layer; processing the first flexible substrate layer to form a first groove corresponding to the first via, wherein the first via and the first groove are mutually communicated, and an orthographic projection of the first groove on the first flexible substrate layer includes an orthographic projection of the first via on the first flexible substrate layer; forming a second flexible substrate layer on a side of the first connection layer away from the first flexible substrate layer; sequentially forming a second barrier layer, a driving structure layer, a light-emitting element, and an encapsulation layer; and peeling off the rigid base substrate to obtain the display substrate.

In an exemplary embodiment, an orthographic projection of a surface of the first groove on a side close to the first via on the first flexible substrate layer is smaller than or equal to an orthographic projection of a surface of the first groove on a side away from the first via on the first flexible substrate layer.

In an exemplary embodiment, the first flexible substrate layer is processed by a gas etching process, and an etching gas includes any one of oxygen, a combination gas of carbon tetrafluoride and oxygen, and a combination gas of sulfur hexafluoride and oxygen.

In an exemplary embodiment, the first flexible substrate layer and the second flexible substrate layer are made of a same material, the material of the first flexible substrate layer or the second flexible substrate layer includes one or a combination of more of polyimide, polyetherimide, polyphenylene sulfide and polyarylate.

Other features and advantages of the present disclosure will be described in the subsequent specification, and partly become apparent from the specification, or may be understood by implementing the present disclosure. Other advantages of the present disclosure may be implemented and achieved through the solutions described in the specification and accompanying drawings.

Other aspects may be comprehended upon reading and understanding of the drawings and detailed descriptions.

BRIEF DESCRIPTION OF DRAWINGS

The accompanying drawings are used to provide an understanding of technical solutions of the present disclosure, constitute a part of the specification, are used to explain the technical solutions of the present disclosure together with embodiments of the present disclosure, and do not constitute limitations to the technical solutions of the present disclosure.

DETAILED DESCRIPTION

Figure 1:
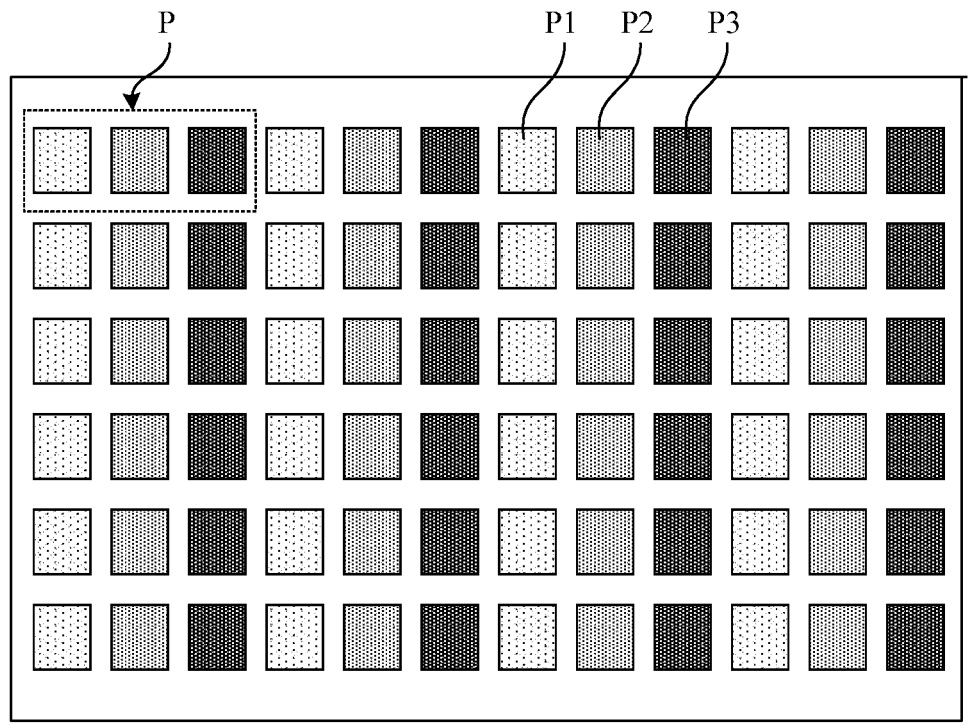
FIG. 1 is a schematic diagram of a planar structure of a display substrate according to an embodiment of the present disclosure.

Hereinafter, the embodiments of the present disclosure will be described in detail in combination with the accompanying drawings. It is noted that the embodiments may be implemented in a plurality of different forms. Those of ordinary skills in the art may easily understand a fact that the embodiments and contents may be transformed into various forms without departing from the purpose and scope of the present disclosure. Therefore, the present disclosure should not be interpreted as being limited to the contents described in the following embodiments. The embodiments in the present disclosure and features in the embodiments may be randomly combined with each other if there is no conflict.

In the drawings, a size of each constituent element, or a thickness or an area of a layer, is sometimes exaggerated for clarity. Therefore, one embodiment of the present disclosure is not necessarily limited to the size illustrated in the drawings, and shapes and sizes of various components in the drawings do not reflect actual scales. In addition, the drawings schematically illustrate ideal examples, and one embodiment of the present disclosure is not limited to the shapes, numerical values or the like illustrated in the drawings.

In the specification, "first", "second", "third" and other ordinal numerals are configured to avoid confusion between the constituent elements, and are not intended to limit in terms of quantity.

In the specification, for convenience, wordings such as "middle", "up", "down", "front", "back", "vertical", "horizontal", "top", "bottom", "inside", and "outside" indicating orientations or positional relations are used to describe positional relations between the constituent elements with reference to the drawings, and are only for the convenience of describing the specification and simplifying the description, instead of indicating or implying that an apparatus or element referred to necessarily must have a specific orientation or be constructed and operated in a specific orientation, so the wordings should not be construed as limitations to the present disclosure. The positional relations of the constituent elements may be appropriately changed according to directions in which constituent elements are described. Therefore, the wordings described herein are not restrictive, and may be appropriately replaced according to a situation.

In the specification, unless otherwise specified and limited, the terms "mount", "couple", and "connect" should be understood in a broad sense. For example, a connection may be a fixed connection, a detachable connection, or an integrated connection, it may be a mechanical connection or an electrical connection, or it may be a direct connection, an indirect connection through a middleware, or internal communication between two components. Those of ordinary skill in the art may understand meanings of the terms in the present disclosure according to a situation.

In the specification, a transistor refers to an element which includes at least three terminals, i.e., a gate electrode, a drain electrode, and a source electrode. The transistor has a channel area between the drain electrode (drain electrode terminal, drain area, or drain electrode) and the source electrode (source electrode terminal, source area, or source electrode), and a current may flow through the drain electrode, the channel area, and the source electrode. It is noted that in the description, the channel area refers to an area through which the current mainly flows.

In the specification, a first electrode may be the drain electrode and a second electrode may be the source electrode, or the first electrode may be the source electrode and the second electrode may be the drain electrode. In a case of using transistors with opposite polarities or in a case where a direction of a current in circuit operation changes, a function of the "source electrode" and that of the "drain electrode" may be interchanged sometimes. Therefore, in the specification, the "source electrode" and the "drain electrode" may be interchanged.

In the specification, "electrical connection" includes a case where constituent elements are connected together through an element having a certain electrical action. The "element having a certain electrical function" is not particularly limited as long as it may send and receive an electrical signal between the connected constituent components. Examples of the "element having a certain electrical function" include not only electrodes and wirings, but also switching elements such as transistors, resistors, inductors, capacitors, and other elements having various functions.

In the specification, "parallel" refers to a state where an angle formed by two straight lines is above −10° and below 10°, and thus includes a state where the angle is above −5° and below 5°. In addition, "vertical" refers to a state where two straight lines form an angle above 80° and below 100°, and thus includes a state where the angle is above 85° and below 95°.

In the specification, "film" and "layer" are interchangeable. For example, "conductive layer" may be replaced with "conductive film" sometimes. Similarly, "insulating film" may be replaced with "insulating layer" sometimes.

In the present disclosure, "about" means that a limit is not strictly limited, and a value within a range of process and measurement error is allowed.

In production of a flexible display panel, a base material of a flexible substrate is generally a high temperature resistant polymer since an electrode or a Thin Film Transistor (TFT) material needs to be sputtered on the flexible substrate. The flexible substrate is usually made of a three-layer structure of a first flexible substrate layer, a connection layer, and a second flexible substrate layer. However, when the flexible substrate is curled, peeling often occurs between the second flexible substrate layer and the connection layer due to a weak adhesive force, which has severe impact on performance of a flexible product.

FIG. 1 is a schematic diagram of a planar structure of a display substrate according to an exemplary embodiment of the present disclosure. As shown in FIG. 1, the display substrate may include a plurality of pixel units P arranged in a matrix manner. At least one of the plurality of pixel units P includes a first light-emitting unit P1 that emits light of a first color, a second light-emitting unit P2 that emits light of a second color, and a third light-emitting unit P3 that emits light of a third color. The first light-emitting unit P1, the second light-emitting unit P2, and the third light-emitting unit P3 each include a pixel drive circuit and a light-emitting element. A pixel drive circuit in the first light-emitting unit P1 is connected to a scanning signal line, a pixel drive circuit in the second light-emitting unit P2 is connected to a data signal line, a pixel drive circuit in the third light-emitting unit P3 is connected to a light-emitting signal line. And the pixel drive circuit is configured to receive a data voltage transmitted by the data signal line under control of the scanning signal line and the light-emitting signal line, and output a corresponding current to the light-emitting element.

A light-emitting element in the first light-emitting unit P1 is connected to the pixel drive circuit of the light-emitting unit where this light-emitting element is located, a light-emitting element in the second light-emitting unit P2 is connected to the pixel drive circuit of the light-emitting unit where this light-emitting element is located, and a light-emitting element in the third light-emitting unit P3 is connected to the pixel drive circuit of the light-emitting unit where this light-emitting element is located. A light-emitting element is configured to emit light of corresponding brightness in response to a current output by a pixel drive circuit of a light-emitting unit where this light-emitting element is located.

In an exemplary embodiment, a pixel unit P may include a red (R) light-emitting unit, a green (G) light-emitting unit, and a blue (B) light-emitting unit, or may include a red light-emitting unit, a green light-emitting unit, a blue light-emitting unit, and a white light-emitting unit, which is not limited in the present disclosure. In an exemplary embodiment, a shape of a light-emitting unit in a pixel unit may be a rectangle, a rhombus, a pentagon, or a hexagon. When the pixel unit includes three light-emitting units, the three light-emitting units may be arranged horizontally, vertically, or in a " 品 "-shape. When the pixel unit includes four light-emitting units, the four light-emitting units may be arranged horizontally, vertically, or in a square shape, which is not limited in the present disclosure.

Figure 2:
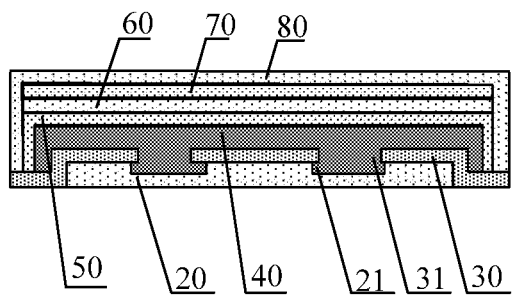
FIG. 2 is a schematic diagram of a sectional structure of a display substrate according to an embodiment of the present disclosure.
Figure 3:
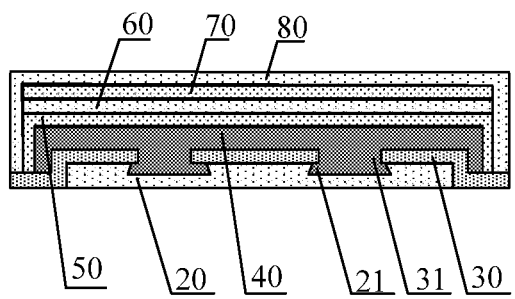
FIG. 3 is another schematic diagram of a sectional structure of a display substrate according to an embodiment of the present disclosure.

FIG. 2 is a schematic diagram of a sectional structure of a display substrate according to an exemplary embodiment of the present disclosure, and FIG. 3 is another schematic diagram of a sectional structure of a display substrate according to an exemplary embodiment of the present disclosure. As shown in FIGS. 2 and 3, the display substrate includes a flexible substrate, a driving structure layer 60 disposed on the flexible substrate, a light-emitting element 70 disposed on the driving structure layer 60, and an encapsulation layer 80 disposed on the light-emitting element 70. In some possible implementations, the display substrate may include other film layers, such as a pillar spacer, which is not limited in the present disclosure.

The flexible substrate sequentially includes a first flexible substrate layer 20, a first connection layer 30, and a second flexible substrate layer 40 from bottom to top, wherein at least one first via 31 is disposed on the first connection layer 30, and at least one first groove 21 corresponding to the first via 31 is disposed on the first flexible substrate layer 20, and the first via 31 and the first groove 21 are mutually communicated.

The first via 31 exposes a partial area of the first groove 21, that is, an orthographic projection of the first groove 21 on the first flexible substrate layer 20 includes an orthographic projection of the first via 31 on the first flexible substrate layer 20.

According to the display substrate provided by the embodiment of the present disclosure, at least one first via 31 is provided on the first connection layer 30, and a first groove 21 is provided on the first flexible substrate layer 20 below the first via 31, so that an Undercut structure is formed between the first flexible substrate layer 20 and the first connection layer 30, which improves an adhesive force between the second flexible substrate layer 40 and the first connection layer 30, and thereby solving a problem of peeling between the second flexible substrate layer 40 and the first connection layer 30 that often occurs during a curling process of a flexible product, and improving a product yield.

Figure 4:
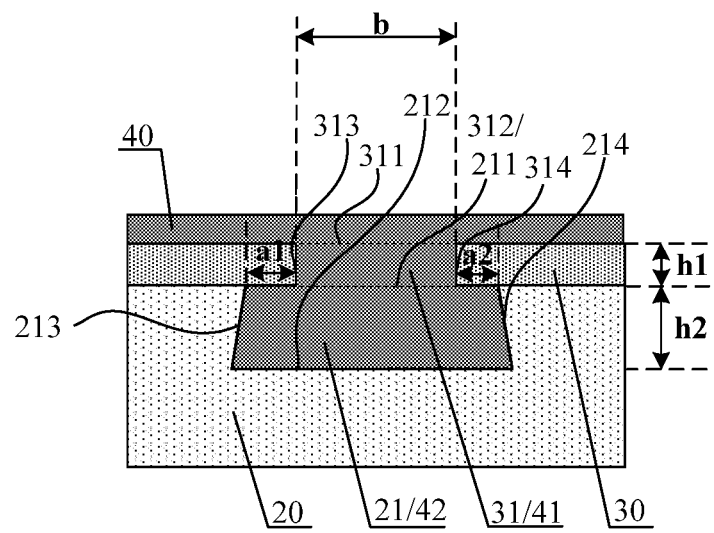
FIG. 4 is a schematic diagram of an enlarged structure of an area A in FIG. 3.

In an exemplary embodiment, as shown in FIG. 3 and FIG. 4, an orthographic projection of a surface of the first groove 21 on a side close to the first via 31 on the first flexible substrate layer is smaller than or equal to an orthographic projection of a surface of the first groove 21 on a side away from the first via 31 on the first flexible substrate layer 20.

In an exemplary embodiment, as shown in FIG. 4, in a direction perpendicular to a display substrate, a first via 31 includes a first surface 311 on a side away from a first groove 21, a second surface 312 on a side close to the first groove 21 and opposite to the first surface 311, and a first side surface 313 and a second side surface 314 disposed between the first surface 311 and the second surface 312.

The first groove 21 includes a third surface 211 partially overlapped with the second surface 312, a fourth surface 212 opposite to the third surface 211, and a third side surface 213 and a fourth side surface 214 disposed between the third surface 211 and the fourth surface 212, wherein the first side surface 313 and the third side surface 213 are located on one side of the first via 31 and the first groove 21, and the second side surface 314 and the fourth side surface 214 are located on the other side of the first via 31 and the first groove 21.

A distance a1 between the first side surface 313 of the first via 31 and the third side surface 213 of the first groove 21 corresponding to the first via 31 is 0.4 microns to 0.6 microns; and a distance a2 between the second side surface 314 of the first via 31 and the fourth side surface 214 of the first groove 21 corresponding to the first via 31 is 0.4 microns to 0.6 microns.

Exemplarily, the distance a1 between the first side surface 313 of the first via 31 and the third side surface 213 of the first groove 21 corresponding to the first via 31 is 0.5 microns; and the distance a2 between the second side surface 314 of the first via 31 and the fourth side surface 214 of the first groove 21 corresponding to the first via 31 is 0.5 microns.

In an exemplary embodiment, in a direction parallel to the display substrate, a shape of the first via 31 includes any one or more of the following: round, square, diamond, parallelogram, pentagon, and hexagon.

In an exemplary embodiment, as shown in FIG. 4, in the direction perpendicular to the display substrate, a width b of the first via 31 is 5 to 20 microns, and since the first via 31 penetrates the first connection layer 30, a height h1 of the first via 31 is the same as a thickness of the first connection layer 30.

In an exemplary embodiment, as shown in FIG. 4, a height h2 of the first groove 21 is 1 micron to 2 microns.

In an exemplary embodiment, as shown in FIG. 4, a surface of the second flexible substrate layer 40 facing the first flexible substrate layer 20 includes a plurality of protrusions, each of which includes a first protruding portion 41 for filling the first via 31 on the first connection layer 30 and a second protruding portion 42 for filling the first groove 21 on the first flexible substrate layer 20, the second flexible substrate layer 40 and the first protruding portion 41, and the first protruding portion 41 and the second protruding portion 42 are all connected to each other in an integrated structure.

Figure 5:
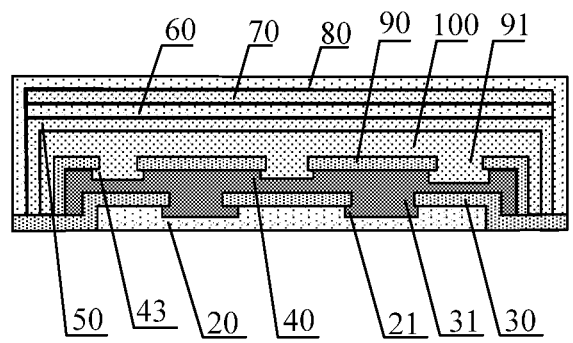
FIG. 5 is another schematic diagram of a sectional structure of a display substrate according to an embodiment of the present disclosure.

In an exemplary embodiment, as shown in FIG. 5, the display substrate may further include a second connection layer 90 and a third flexible substrate layer 100 on the second flexible substrate layer 40, wherein the second connection layer 90 may include a plurality of second vias 91, the second flexible substrate layer 40 includes a plurality of second grooves 43, and a second via 91 exposes a partial area of a second groove 43, that is, an orthographic projection of the second groove 43 on the first flexible substrate layer 20 includes an orthographic projection of the second via 91 on the first flexible substrate layer 20, and an orthographic projection of the second groove 43 on the first flexible substrate layer 20 is not overlapped with an orthographic projection of the first groove 21 on the first flexible substrate layer 20.

A preparation process of the display substrate will be exemplarily described below. A "patterning process" mentioned in the present disclosure includes coating with a photoresist, mask exposure, development, etching, photoresist stripping, and other processing for a metal material, an inorganic material, or a transparent conductive material, and includes coating with an organic material, mask exposure, development, and other processing for the organic material. Deposition may be any one or more of sputtering, evaporation, and chemical vapor deposition, coating may be any one or more of spray coating, spin coating, and inkjet printing, and etching may be any one or more of dry etching and wet etching, which is not limited in the present disclosure. "Thin film" refers to a layer of thin film made of a material on a substrate by deposition, coating, or other processes. If a patterning process is not needed by the "thin film" in a whole making process, the "thin film" may also be called a "layer". If the patterning process is needed by the "thin film" in the whole making process, the thin film is called a "thin film" before the patterning process and called a "layer" after the patterning process. The "layer" after the patterning process includes at least one "pattern". "A and B are arranged in a same layer" mentioned in the present disclosure refers to that A and B are simultaneously formed by a same patterning process. A "thickness" of a film layer is a size of the film layer in a direction perpendicular to the display substrate. In the exemplary embodiment of the present disclosure, "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

Figure 6:
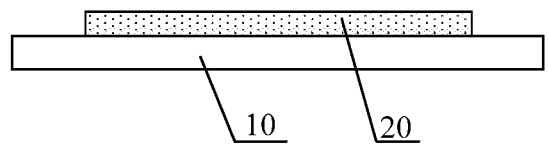
FIG. 6 is a schematic diagram of a structure of a display substrate after a first flexible substrate layer is formed according to an embodiment of the present disclosure.

(1) As shown in FIG. 6, a first flexible substrate layer 20 is formed on a rigid base substrate 10.

In this act, the rigid base substrate 10 may be a substrate made of a material with certain firmness, such as glass, quartz, or transparent resin. The first flexible substrate layer 20 may be one or a combination of more of Polyimide (PI), polyetherimide (PEI), polyphenylene sulfide (PPS), and polyarylate (PAR).

In some embodiments, forming the first flexible substrate layer 20 on the rigid base substrate 10 may include that: the rigid base substrate 10 is coated with a layer of PI solution, and the PI solution is dried to remove a solvent of the PI solution, so that a solute of the PI solution remains to form the first flexible substrate layer 20. A drying process may be, for example, a low-pressure drying process, a high-pressure drying process, or an air-cooled drying process, which is not limited in the embodiment of the present disclosure.

Figure 7:
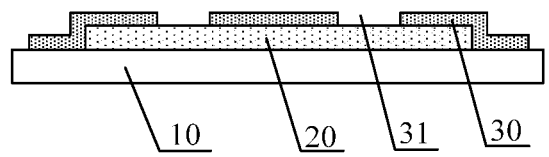
FIG. 7 is a schematic diagram of a structure of a display substrate after a first connection layer is formed according to an embodiment of the present disclosure.

(2) As shown in FIG. 7, a first connection layer 30 is formed on a side of the first flexible substrate layer 20 away from the rigid base substrate 10, and a first via 31 is formed on the first connection layer 30.

In this act, the first connection layer 30 may include a first barrier (Barrier1) layer disposed on the first flexible substrate layer 20 and a semiconductor layer disposed on the first barrier layer. The first barrier layer may be made of an inorganic material such as silicon oxide (SiOx), silicon nitride (SiNx), aluminum oxide (Al2O3), or silicon oxynitride (SiOxNx), which is used to improve water and oxygen resistance of a substrate. A material of the semiconductor layer may be amorphous silicon (a-si).

In some embodiments, the first connection layer 30 is formed on the side of the first flexible substrate layer 20 away from the rigid base substrate 10 by coating, magnetron sputtering, thermal evaporation, Plasma Enhanced Chemical Vapor Deposition (PECVD), or other methods, and the first via 31 is formed through a patterning process. The patterning process may include photoresist coating, exposure processing, development processing, etching processing, photoresist stripping, and the like.

In other embodiments, the first connection layer 30 and the first via 31 on the first connection layer 30 may be deposited by using an Open Mask.

In an exemplary embodiment, the first via 31 is disposed in an Active Area (AA) of the display substrate.

Figure 8:
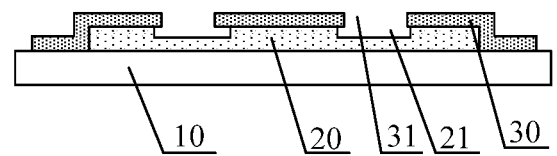
FIG. 8 is a schematic diagram of a structure of a display substrate after a first flexible substrate layer is processed according to an embodiment of the present disclosure.

(3) As shown in FIG. 8, the first flexible substrate layer 20 is processed to form a first groove 21 corresponding to the first via 31, the first via 31 and the first groove 21 are mutually communicated. The first via 31 exposes a partial area of the first groove 21. An orthographic projection of the first groove 21 on the first flexible substrate layer 20 includes an orthographic projection of the first via 31 on the first flexible substrate layer 20.

In some embodiments, the first flexible substrate layer 20 is processed by etching or the like to form the first groove 21 corresponding to the first via 31.

In an exemplary embodiment, the first flexible substrate layer 20 is processed by a gas etching process, and an etching gas may be oxygen ($O_2$) or a combination gas of oxygen and other gases, for example, the etching gas may be a combination gas ($CF_4+O_2$) of carbon tetrafluoride and oxygen or a combination gas ($SF_6+O_2$) of sulfur hexafluoride and oxygen. Since the first connection layer 30 is usually an inorganic layer, etching the first flexible substrate layer 20 with oxygen ($O_2$) has little impact on the first connection layer 30. In addition, during an etching process, the first connection layer 30 may serve as a virtual Mask, which can help the first flexible substrate layer 20 to better form an undercut structure required by an embedded structure.

In some embodiments, a junction surface of the first groove 21 and the first flexible substrate layer 20 is a slope surface. An orthographic projection of a surface of the first groove 21 on a side facing the rigid base substrate 10 on the rigid base substrate 10 is larger than that of a surface of the first groove 21 on a side away from the rigid base substrate 10 on the rigid base substrate 10.

Figure 9:
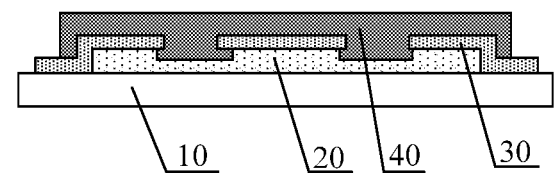
FIG. 9 is a schematic diagram of a structure of a display substrate after a second flexible substrate layer is formed according to an embodiment of the present disclosure.

(4) As shown in FIG. 9, a second flexible substrate layer 40 is formed on the rigid base substrate 10 on which the aforementioned patterns are formed.

In an exemplary embodiment, a material of the second flexible substrate layer 40 may be the same as that of the first flexible substrate layer 20. Since a polymer is mainly composed of covalent bonds, and there are polarities between molecules, according to a principle of similar compatibility, the second flexible substrate layer 40 and the first flexible substrate layer 20 are made of a same material, which is more conducive to increasing adhesion between film layers.

Exemplarily, forming the second flexible substrate layer 40 may include: a layer of PI solution is coated on the rigid base substrate 10 with the aforementioned patterns, and the PI solution is dried to remove a solvent of the PI solution, so that a solute of the PI solution remains to form the second flexible substrate layer 40, thus completing preparation of a flexible substrate.

Figure 10:
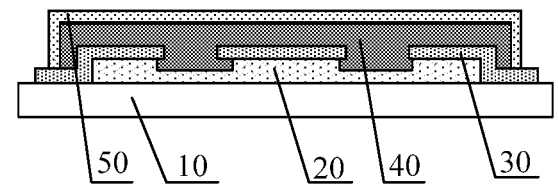
FIG. 10 is a schematic diagram of a structure of a display substrate after a barrier layer is formed according to an embodiment of the present disclosure.

(5) As shown in FIG. 10, a barrier thin film is deposited on the second flexible substrate layer 40 to form a second barrier (Barrier2) layer 50 covering the second flexible substrate layer 40.

Figure 11:
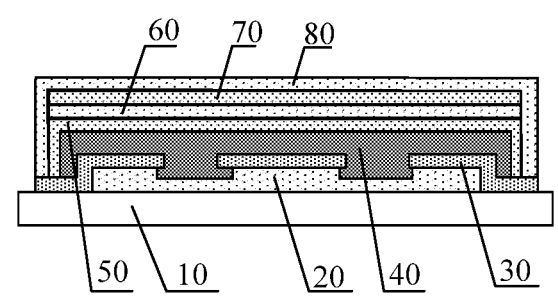
FIG. 11 is a schematic diagram of a structure of a display substrate after an encapsulation layer is formed according to an embodiment of the present disclosure.

(6) As shown in FIG. 11, patterns of a driving structure layer 60, a light-emitting element 70, and an encapsulation layer 80 are sequentially formed on the second barrier layer 50.

In an exemplary embodiment, the driving structure layer 60 includes: a first insulating layer disposed on a second barrier layer 50, an active layer disposed on the first insulating layer, a second insulating layer covering the active layer, a first gate metal layer disposed on the second insulating layer, a third insulating layer covering the first gate metal layer, a second gate metal layer disposed on the third insulating layer, a fourth insulating layer covering the second gate metal layer, and a source and drain metal layer disposed on the fourth insulating layer. The active layer includes at least a first active layer, the first gate metal layer at least includes a first gate electrode and a first capacitor electrode, the second gate metal layer at least includes a second capacitor electrode, and the source and drain metal layer at least includes a first source electrode and a first drain electrode; the first active layer, the first gate electrode, the first source electrode, and the first drain electrode constitute a first transistor, and the first capacitor electrode and the second capacitor electrode constitute a first storage capacitor. In an exemplary embodiment, the first transistor may be a drive transistor in a pixel drive circuit, and the drive transistor may be a Thin Film Transistor (TFT).

In an exemplary embodiment, the first insulating layer, the second insulating layer, the third insulating layer, and the fourth insulating layer may be made of any one or more of silicon oxide (SiOx), silicon nitride (SiNx), and silicon oxynitride (SiON), and may be a single layer, multilayer, or a composite layer. The first insulating layer is referred to as a Buffer layer for improving water and oxygen resistance of a substrate. The second and the third insulating layers are referred to as gate insulating (GI) layers. The fourth insulating layer is referred to as an interlayer insulating (ILD) layer. A first metal film, a second metal film, and a third metal film may be a metal material, such as any one or more of silver (Ag), copper (Cu), aluminum (Al), titanium (Ti), and molybdenum (Mo), or an alloy material of the above metals, such as an aluminum neodymium alloy (AlNd) or a molybdenum niobium alloy (MoNb), which may be a single-layer structure or a multilayer composite structure, such as Ti/Al/Ti. An active layer thin film may be made of amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene, and other materials, that is, the present disclosure is applicable to transistors manufactured on a basis of an oxide technology, a silicon technology, and an organic technology.

In an exemplary embodiment, the light-emitting element 70 may include an anode, a pixel definition layer (PDL), a pillar spacer (PS), an organic light-emitting layer, a cathode, and the like. The anode is disposed on a first planarization layer, and is connected to a first drain electrode of a drive transistor through a via formed on the first planarization layer; the pixel definition layer is disposed on the anode and the planarization layer, and the pixel definition layer is provided with a pixel opening exposing the anode; the organic light-emitting layer is at least partially disposed in the pixel opening, and is connected to the anode; the cathode is disposed on the organic light-emitting layer, and is connected to the organic light-emitting layer; and the organic light-emitting layer emits light of corresponding colors under driving of the anode and the cathode.

In an exemplary implementation, the encapsulation layer 80 may include a first encapsulation layer, a second encapsulation layer, and a third encapsulation layer that are stacked together; the first encapsulation layer and the third encapsulation layer are made of an inorganic material, and the second encapsulation layer is made of an organic material.

(7) The rigid base substrate 10 is peeled off to obtain the display substrate.

In some embodiments, the rigid base substrate 10 is peeled off through a laser lift-off process.

In other exemplary embodiments, after forming the second flexible substrate layer 40 and before forming the second barrier layer 50, the preparation process may further include: a second connection layer 90 is formed and a third flexible substrate layer 100 disposed on the second connection layer 90 is formed, the second connection layer 90 is provided with at least one second via 91 and the second flexible substrate layer 40 is provided with at least one second groove 43. The second via 91 exposes a partial area of the second groove 43, and an orthographic projection of the second groove 43 on the first flexible substrate layer 20 includes an orthographic projection of the second via 91 on the first flexible substrate layer 20.

The orthographic projection of the second groove 43 on the first flexible substrate layer 20 is not overlapped with the orthographic projection of the first groove 21 on the first flexible substrate layer 20.

It may be seen from the structure and the preparation process of the display substrate according to the exemplary embodiment of the present disclosure that, by providing a hole on the first connection layer 30 and processing the first flexible substrate layer 20 under an opening area, an Undercut structure is formed between the first flexible substrate layer 20 and the first connection layer 30, which improves an adhesive force between the second flexible substrate layer 40 and the first connection layer 30, and thereby solving a problem of peeling between the second flexible substrate layer 40 and the first connection layer 30 that often occurs during a curling process of a flexible product, and improving a product yield.

The structure of the display substrate and the preparation process thereof according to the exemplary embodiments of the present disclosure are merely an exemplary illustration. In the exemplary embodiments, corresponding structures may be changed and patterning processes may be added or reduced according to actual needs, which is not limited in the present disclosure.

Figure 12:
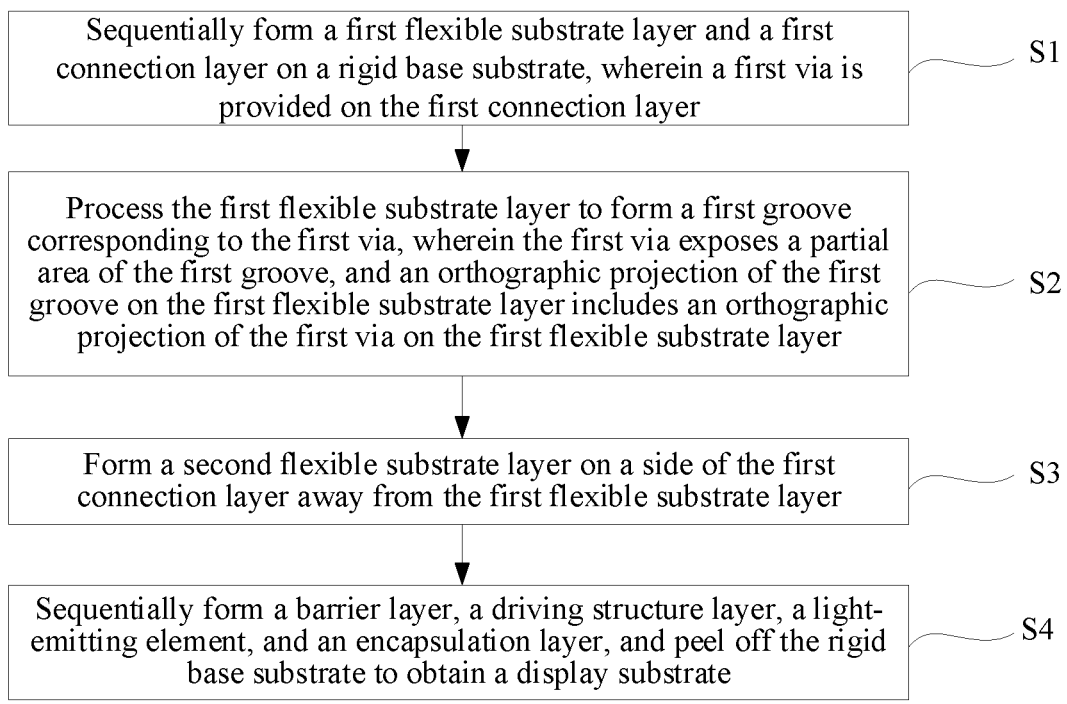
FIG. 12 is a flowchart of a preparation method of a display substrate according to an embodiment of the present disclosure.

As shown in FIG. 12, an exemplary embodiment of the present disclosure further provides a preparation method of a display substrate, which includes the following acts.

Act S1: sequentially forming a first flexible substrate layer and a first connection layer on a rigid base substrate, wherein a first via is provided on the first connection layer.

Act S2: processing the first flexible substrate layer to form a first groove corresponding to the first via, the first via and the first groove are mutually communicated, and the first via exposes a partial area of the first groove, that is, an orthographic projection of the first groove on the first flexible substrate layer includes an orthographic projection of the first via on the first flexible substrate layer.

Act S3, forming a second flexible substrate layer on a side of the first connection layer away from the first flexible substrate layer.

Act S4, sequentially forming a second barrier layer, a driving structure layer, a light-emitting element, and an encapsulation layer, and peeling off the rigid base substrate to obtain a display substrate.

In an exemplary embodiment, an orthographic projection of a surface of the first groove on a side close to the first via on the first flexible substrate layer is smaller than or equal to an orthographic projection of a surface of the first groove on a side away from the first via on the first flexible substrate layer.

In an exemplary embodiment, the first flexible substrate layer is processed by a gas etching process, and an etching gas includes any one of oxygen, a combination gas of carbon tetrafluoride and oxygen, and a combination gas of sulfur hexafluoride and oxygen.

In an exemplary embodiment, in a direction perpendicular to the display substrate, the first via includes a first surface on a side away from the first groove, a second surface on a side close to the first groove and opposite to the first surface, and a first side surface and a second side surface disposed between the first surface and the second surface.

The first groove includes a third surface partially overlapped with the second surface, a fourth surface opposite to the third surface, and a third side surface and a fourth side surface disposed between the third surface and the fourth surface, wherein the first side surface and the third side surface are located on one side of the first via and the first groove, and the second side surface and the fourth side surface are located on the other side of the first via and the first groove.

A distance between the first side surface of the first via and the third side surface of the first groove corresponding to the first via is 0.4 microns to 0.6 microns; and a distance between the second side surface of the first via and the fourth side surface of the first groove corresponding to the first via is 0.4 microns to 0.6 microns.

In an exemplary embodiment, the first flexible substrate layer and the second flexible substrate layer are made of a same material, the material of the first flexible base layer or the second flexible base layer includes: one or a combination of more of polyimide (PI), polyetherimide (PEI), polyphenylene sulfide (PPS), and polyarylate (PAR).

In an exemplary embodiment, in a direction parallel to the display substrate, a shape of the first via includes any one or more of the following: round, square, diamond, parallelogram, pentagon, and hexagon.

In an exemplary embodiment, in a direction perpendicular to the display substrate, a width of the first via is 5 to 20 microns, and a height of the first via is the same as a thickness of the first connection layer.

In an exemplary embodiment, in a direction perpendicular to the display substrate, a height of the first groove 21 is 1 micron to 2 microns.

An exemplary embodiment of the present disclosure further provides a display apparatus which includes the display substrate of the aforementioned embodiments. The display apparatus in the present disclosure may be any product or component with a display function, such as a mobile phone, a tablet computer, a television, a display, a laptop computer, a digital photo frame, or a navigator. In an exemplary embodiment, the display apparatus may be a wearable display apparatus, which can be worn on a human body in some ways, such as a smart watch and a smart wristband.

The drawings in the present disclosure only refer to structures involved in the present disclosure, and common designs may be referred to for other structures. If there is no conflict, the embodiments of the present disclosure, i.e., features in the embodiments may be combined with each other to obtain a new embodiment.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising: a flexible substrate, a driving structure layer disposed on the flexible substrate, a light-emitting element disposed on the driving structure layer, and an encapsulation layer disposed on the light-emitting element; wherein
   the flexible substrate comprises a first flexible substrate layer, a first connection layer disposed on the first flexible substrate layer, and a second flexible substrate layer disposed on the first connection layer, wherein
   the first connection layer comprises at least one first via,
   the first flexible substrate layer comprises at least one first groove provided corresponding to the first via,
   the first via and the first groove are mutually communicated, and
   an orthographic projection of the first groove on the first flexible substrate layer comprises an orthographic projection of the first via on the first flexible substrate layer.

2. The display substrate according to claim 1, wherein an orthographic projection of a surface of the first groove on a side close to the first via on the first flexible substrate layer is smaller than or equal to an orthographic projection of a surface of the first groove on a side away from the first via on the first flexible substrate layer.

3. The display substrate according to claim 1, wherein in a direction perpendicular to the display substrate, the first via comprises a first surface on a side away from the first groove, a second surface on a side close to the first groove and opposite to the first surface, and a first side surface and a second side surface disposed between the first surface and the second surface;
   the first groove comprises a third surface partially overlapped with the second surface, a fourth surface opposite to the third surface, and a third side surface and a fourth side surface disposed between the third surface and the fourth surface, wherein the first side surface and the third side surface are located on one side of the first via and the first groove, and the second side surface and the fourth side surface are located on the other side of the first via and the first groove;
   a distance between the first side surface of the first via and the third side surface of the first groove corresponding to the first via is 0.4 microns to 0.6 microns; and
   a distance between the second side surface of the first via and the fourth side surface of the first groove corresponding to the first via is 0.4 microns to 0.6 microns.

4. The display substrate according to claim 1, wherein
   the first flexible substrate layer and the second flexible substrate layer are made of a same material, and
   the material of the first flexible substrate layer or the second flexible substrate layer comprises one or a combination of more of polyimide, polyetherimide, polyphenylene sulfide, and polyarylate.

5. The display substrate according to claim 1, wherein in a direction parallel to the display substrate, a shape of the first via comprises any one or more of the following: round, square, diamond, parallelogram, pentagon, and hexagon.

6. The display substrate according to claim 1, wherein in a direction perpendicular to the display substrate, a width of the first via is 5 to 20 microns.

7. The display substrate according to claim 1, wherein in a direction perpendicular to the display substrate, a height of the first groove is 1 micron to 2 microns.

8. The display substrate according to claim 1, wherein
   the display substrate further comprises a second connection layer and a third flexible substrate layer,
   the second connection layer comprises at least one second via, and the second flexible substrate layer comprises at least one second groove,
   the second via and the second groove are mutually communicated,
   an orthographic projection of the second groove on the first flexible substrate layer comprises an orthographic projection of the second via on the first flexible substrate layer, and
   the orthographic projection of the second groove on the first flexible substrate layer is not overlapped with the orthographic projection of the first groove on the first flexible substrate layer.

9. A display apparatus comprising a display substrate, wherein the display substrate comprises a flexible substrate, a driving structure layer disposed on the flexible substrate, a light-emitting element disposed on the driving structure layer, and an encapsulation layer disposed on the light-emitting element;
   the flexible substrate comprises a first flexible substrate layer, a first connection layer disposed on the first flexible substrate layer, and a second flexible substrate layer disposed on the first connection layer, wherein,
   the first connection layer comprises at least one first via, and the first flexible substrate layer comprises at least one first groove provided corresponding to the first via;
   the first via and the first groove are mutually communicated, and an orthographic projection of the first groove on the first flexible substrate layer comprises an orthographic projection of the first via on the first flexible substrate layer.

10. The display apparatus according to claim 9, wherein an orthographic projection of a surface of the first groove on a side close to the first via on the first flexible substrate layer is smaller than or equal to an orthographic projection of a surface of the first groove on a side away from the first via on the first flexible substrate layer.

11. The display apparatus according to claim 8, wherein in a direction perpendicular to the display substrate, the first via comprises a first surface on a side away from the first groove, a second surface on a side close to the first groove and opposite to the first surface, and a first side surface and a second side surface disposed between the first surface and the second surface;
   the first groove comprises a third surface partially overlapped with the second surface, a fourth surface opposite to the third surface, and a third side surface and a fourth side surface disposed between the third surface and the fourth surface, wherein the first side surface and the third side surface are located on one side of the first via and the first groove, and the second side surface and the fourth side surface are located on the other side of the first via and the first groove;

a distance between the first side surface of the first via and the third side surface of the first groove corresponding to the first via is 0.4 microns to 0.6 microns; and a distance between the second side surface of the first via and the fourth side surface of the first groove corresponding to the first via is 0.4 microns to 0.6 microns.

12. The display apparatus according to claim 9, wherein the first flexible substrate layer and the second flexible substrate layer are made of a same material, the material of the first flexible substrate layer or the second flexible substrate layer comprises one or a combination of more of polyimide, polyetherimide, polyphenylene sulfide, and polyarylate.

13. The display apparatus according to claim 9, wherein in a direction parallel to the display substrate, a shape of the first via comprises any one or more of the following: round, square, diamond, parallelogram, pentagon, and hexagon.

14. The display apparatus according to claim 9, wherein in a direction perpendicular to the display substrate, a width of the first via is 5 to 20 microns.

15. The display apparatus according to claim 9, wherein in a direction perpendicular to the display substrate, a height of the first groove 21 is 1 micron to 2 microns.

16. The display apparatus according to claim 9, further comprising a second connection layer and a third flexible substrate layer, wherein
the second connection layer comprises at least one second via,
the second flexible substrate layer comprises at least one second groove,
the second via and the second groove are mutually communicated,
an orthographic projection of the second groove on the first flexible substrate layer comprises an orthographic projection of the second via on the first flexible substrate layer, and
the orthographic projection of the second groove on the first flexible substrate layer is not overlapped with the orthographic projection of the first groove on the first flexible substrate layer.

17. A preparation method of a display substrate, comprising:
sequentially forming a first flexible substrate layer and a first connection layer on a rigid base substrate, wherein a first via is provided on the first connection layer;
processing the first flexible substrate layer to form a first groove corresponding to the first via, wherein the first via and the first groove are mutually communicated, and an orthographic projection of the first groove on the first flexible substrate layer comprises an orthographic projection of the first via on the first flexible substrate layer;
forming a second flexible substrate layer on a side of the first connection layer away from the first flexible substrate layer;
sequentially forming a second barrier layer, a driving structure layer, a light-emitting element, and an encapsulation layer; and
peeling off the rigid base substrate to obtain the display substrate.

18. The preparation method according to claim 17, wherein an orthographic projection of a surface of the first groove on a side close to the first via on the first flexible substrate layer is smaller than or equal to an orthographic projection of a surface of the first groove on a side away from the first via on the first flexible substrate layer.

19. The preparation method according to claim 17, wherein the first flexible substrate layer is processed by a gas etching process and an etching gas comprises any one of oxygen, a combination gas of carbon tetrafluoride and oxygen, and a combination gas of sulfur hexafluoride and oxygen.

20. The preparation method according to claim 17, wherein the first flexible substrate layer and the second flexible substrate layer are made of a same material, the material of the first flexible substrate layer or the second flexible substrate layer comprises one or a combination of more of polyimide, polyetherimide, polyphenylene sulfide, and polyarylate.

* * * * *